United States Patent
Lai et al.

(10) Patent No.: US 12,407,343 B2
(45) Date of Patent: Sep. 2, 2025

(54) SEMICONDUCTOR DEVICES AND CIRCUITS WITH INCREASED BREAKDOWN VOLTAGE

(71) Applicant: Taiwan Semiconductor Manufacturing Company, Ltd., Hsin-Chu (TW)

(72) Inventors: Yi-An Lai, Taipei (TW); Chan-Hong Chern, Palo Alto, CA (US); Cheng-Hsiang Hsieh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/629,141

(22) Filed: Apr. 8, 2024

(65) Prior Publication Data
US 2024/0259013 A1    Aug. 1, 2024

Related U.S. Application Data

(63) Continuation of application No. 17/835,688, filed on Jun. 8, 2022, now Pat. No. 11,955,956.

(51) Int. Cl.
*H03K 17/04* (2006.01)
*H02H 9/04* (2006.01)
*H03K 17/0812* (2006.01)

(52) U.S. Cl.
CPC ......... *H03K 17/08128* (2013.01); *H02H 9/04* (2013.01); *H03K 17/08122* (2013.01)

(58) Field of Classification Search
CPC ............ H02H 9/04; H02H 9/00; H02H 9/043; H05K 9/0067; H03K 17/08128; H03K 17/08122; H01L 27/0285

USPC .......................................... 361/56, 91.1, 111
See application file for complete search history.

(56) References Cited

U.S. PATENT DOCUMENTS

| | | | |
|---|---|---|---|
| 8,848,419 B2 | 9/2014 | Wu et al. | |
| 9,425,749 B2 | 8/2016 | Gulko et al. | |
| 9,666,683 B2 | 5/2017 | Chiu | |
| 9,780,775 B2 | 10/2017 | Brindle et al. | |
| 2009/0073620 A1 | 3/2009 | Mergens et al. | |
| 2010/0254051 A1* | 10/2010 | Jeon ...................... | H02H 9/046 361/56 |
| 2012/0326235 A1 | 12/2012 | Otsuru et al. | |
| 2014/0078630 A1 | 3/2014 | Koch et al. | |
| 2015/0092307 A1 | 4/2015 | Petruzzi | |

(Continued)

FOREIGN PATENT DOCUMENTS

TW    202131475 A    8/2021

*Primary Examiner* — Danny Nguyen
(74) *Attorney, Agent, or Firm* — HAYNES AND BOONE, LLP

(57) ABSTRACT

A switching circuit includes a main circuit including a number of first transistors. The main circuit has a first node, a second node, and a third node and is operative in response to a control signal received by the first node, and the second node is configured to receive a supply voltage. The switching circuit also includes an auxiliary circuit electrically coupled to the second node of the main circuit and configured to provide surge protection for the main circuit. The auxiliary circuit includes a second transistor. A breakdown voltage of the second transistor is different than a breakdown voltage of each first transistor of the number of first transistors.

20 Claims, 8 Drawing Sheets

(56) References Cited

U.S. PATENT DOCUMENTS

| | | | |
|---|---|---|---|
| 2019/0199091 A1* | 6/2019 | Handy | H03K 17/162 |
| 2019/0377376 A1* | 12/2019 | Graves | H01F 29/146 |
| 2021/0132137 A1 | 5/2021 | Chen | |
| 2021/0210481 A1 | 7/2021 | Guan | |
| 2021/0249404 A1 | 8/2021 | Lai et al. | |
| 2022/0149037 A1 | 5/2022 | Roig-Guitart | |

\* cited by examiner

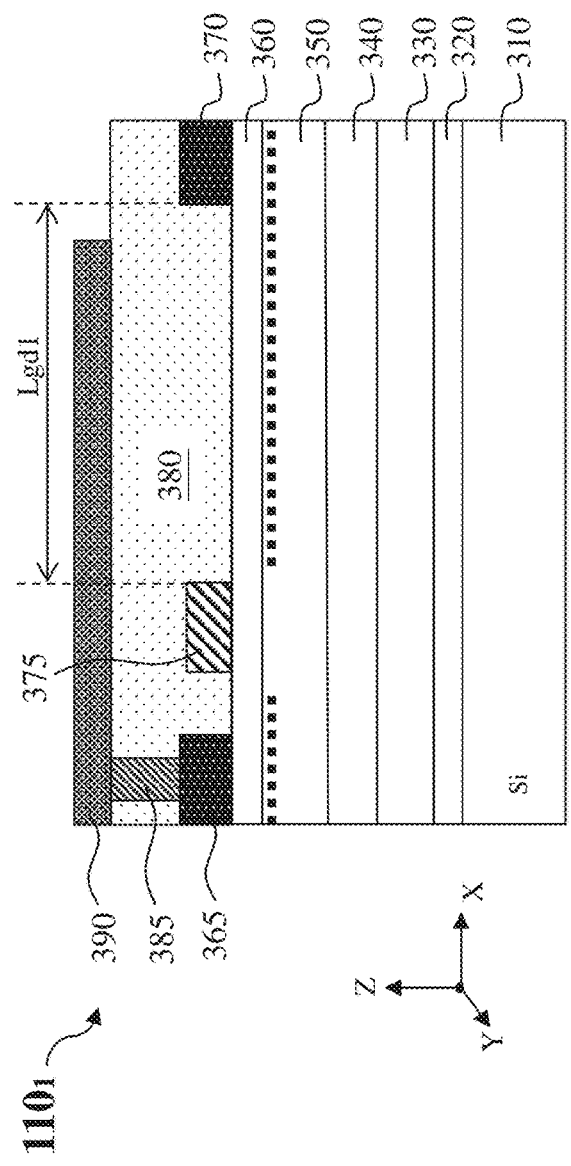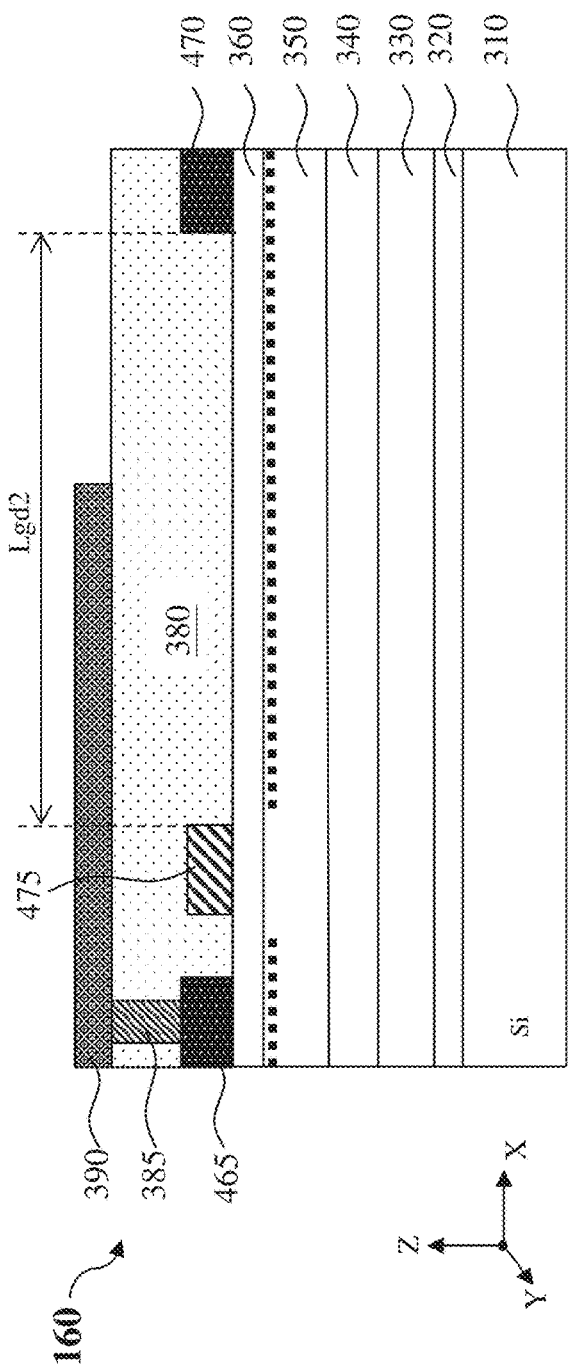

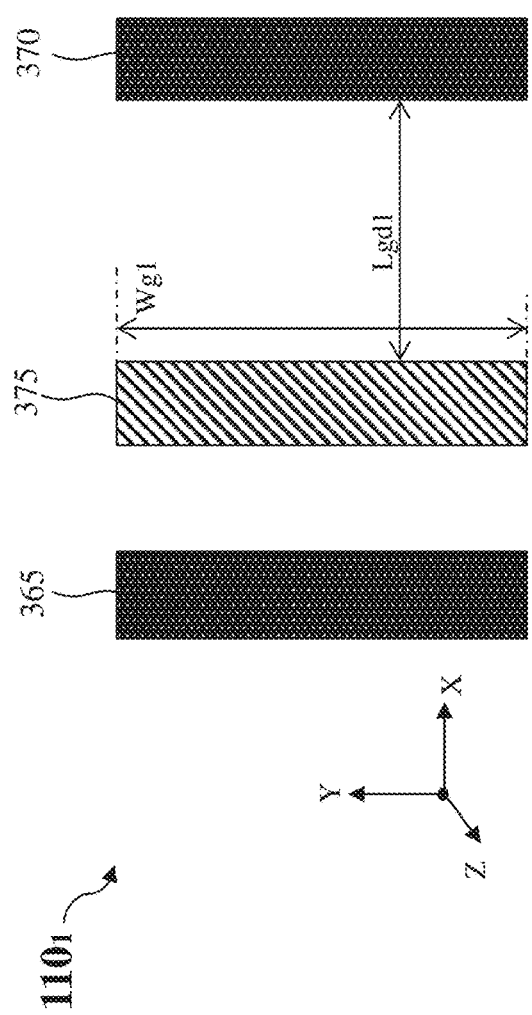
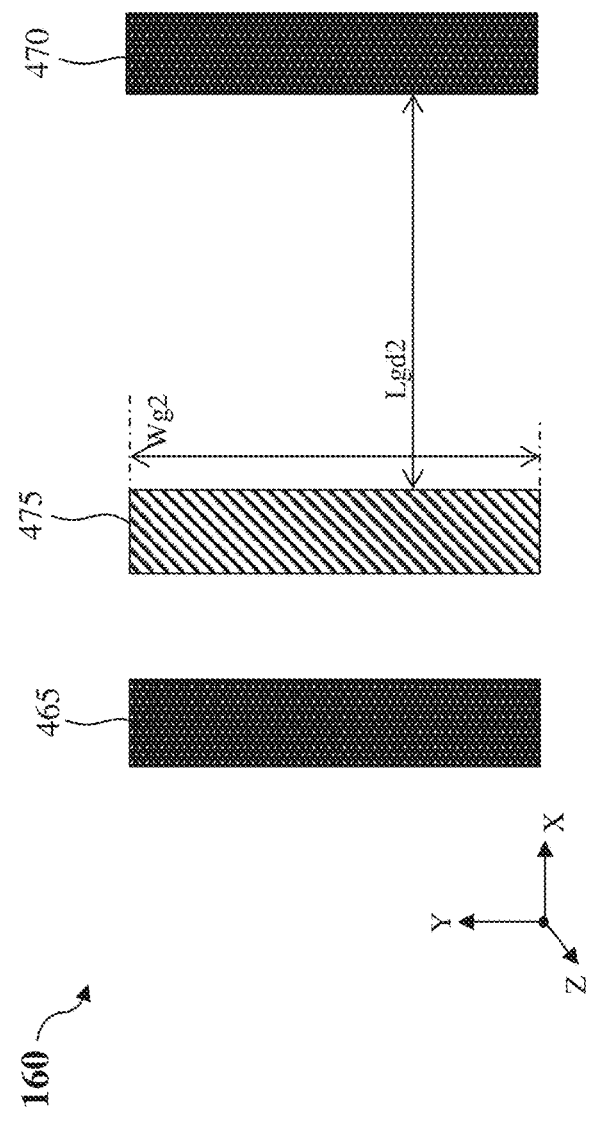

SEMICONDUCTOR DEVICES AND CIRCUITS WITH INCREASED BREAKDOWN VOLTAGE

PRIORITY DATA

The present application is a continuation application of U.S. patent application Ser. No. 17/835,688, filed Jun. 8, 2022, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

In semiconductor technology, Group III-Group V (or III-V) semiconductor compounds (e.g., gallium nitride (GaN)) may be used to form various integrated circuit (IC) devices, such as high-power field-effect transistors (FETs), high frequency transistors, or high-electron-mobility transistors (HEMTs). A high-electron-mobility transistor (HEMT) is a field effect transistor having a 2-dimensional electron gas (2DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high breakdown voltage and low on-resistance. In some examples, due to its high breakdown voltage and low on-resistance, GaN-based HEMT may be used in an integrated circuit (e.g., switching power supplies). However, turning off the switches in the switching power supplies may create voltage spikes, also known as surges. To prevent the damages caused by the voltage spikes, there is a need to further increase the breakdown voltage of the GaN-based HEMT. Accordingly, improvements in this area are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 3 illustrates an exemplary cross-sectional view of a first transistor implemented in the main circuit shown in FIG. 2, according to various aspects of the present disclosure.

FIG. 4 illustrates an exemplary cross-sectional view of a second transistor implemented in the auxiliary circuit shown in FIG. 1, according to various aspects of the present disclosure.

FIG. 5 illustrates a fragmentary top view of the first transistor, according to various aspects of the present disclosure.

FIG. 6 illustrates a fragmentary top view of the second transistor, according to various aspects of the present disclosure.

DETAILED DESCRIPTION

Figure 1:
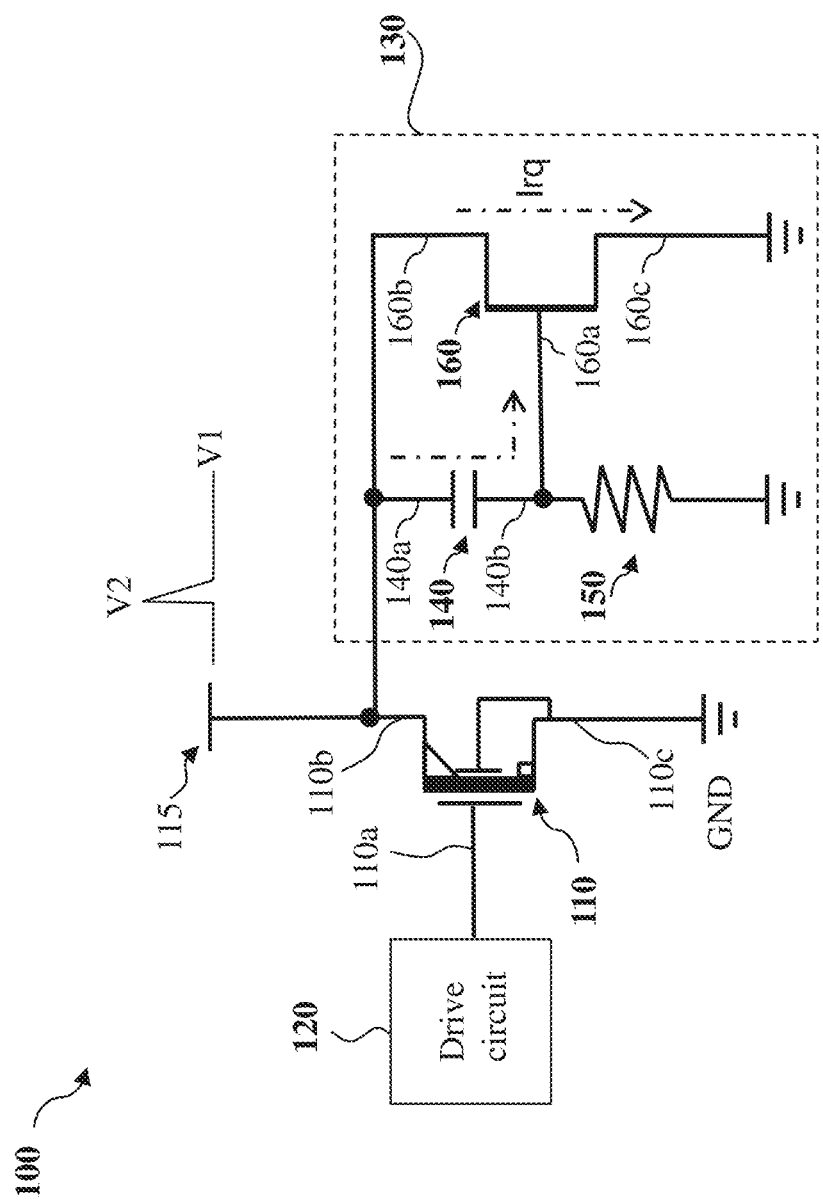
FIG. 1 illustrates a schematic of an exemplary simplified switching circuit having a main circuit and an auxiliary circuit, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Compared with MOSFETs, HEMTs have a number of attractive properties such as high breakdown voltage and low on-resistance, and thus, HEMTs are widely used in various applications. In some embodiments, a switching circuit that includes a number of switch transistors (e.g., HEMTs) may be used in a power conversion circuit (e.g., a DC-DC converter). For example, a number of switch transistors may include HEMTs and may be coupled to a power supply. Turning off those switch transistors may lead to voltage spikes or surges, thereby damaging those switch transistors. For example, each switch transistor may have a breakdown voltage that is about, for example, 650V, and the surge voltage may be about, for example, 800V. Breakdown voltage of those HEMTs may be increased to prevent those HEMT-based switch transistors from being damaged by the voltage spikes. However, increasing the breakdown voltage of those HEMTs from 650V to 800V may include introducing a complicated field plate design and/or increasing a drift region length (i.e., a distance between gate structure and drain feature of the HEMTs), which may provide an increased fabrication cost associated with the formation of the HEMTs or an increased footprint for each HEMT of those HEMTs, thereby taking up an undue amount of real estate in an IC chip.

The present embodiments are directed to methods and circuits that provide surge protection to those HEMTs without increasing the breakdown voltage of the HEMTs. In an embodiment, a switching circuit includes a number of HEMTs connected in parallel and coupled to a power supply. Each of those HEMTs has a first breakdown voltage BV1. The power supply may generate a surge voltage that is greater than the first breakdown voltage BV1. An auxiliary circuit is electrically coupled to the switching circuit to provide surge protection. In an embodiment, the auxiliary circuit includes a HEMT having a second breakdown voltage BV2 greater than the first breakdown voltage BV1. When a surge voltage is generated, the surge voltage may be discharged by the HEMT in the auxiliary circuit. By providing the auxiliary circuit, without increasing the first breakdown voltage BV1, HEMTs in the switching circuit are protected from damage due to voltage overshoot spikes. The various aspects of the present disclosure will now be described in more detail with reference to the figures.

FIG. 1 illustrates a schematic of an exemplary simplified switching circuit 100 having an auxiliary circuit 130, according to various aspects of the present disclosure. In embodiments represented in FIG. 1, the switching circuit 100 includes a main circuit 110. The main circuit 110 has a first node 110a electrically coupled to a drive circuit 120 and configured to receive a control signal from the drive circuit 120. The main circuit 110 also has a second node 110b configured to receive a supply voltage Vpp from a power line 115 (or a power supply 115). The main circuit 110 also includes a third node 110c configured to receive a reference voltage (e.g., ground voltage GND). In the present embodiment, the third node 110c is coupled to a ground voltage. In some embodiments, the main circuit 110 includes a number of switch transistors (e.g., switch transistors $110_1$, $110_2$, ... $110_N$ shown in FIG. 2). Those switch transistors may have a same breakdown voltage BV1. An exemplary schematic of the main circuit 110 is described in further detail with reference to FIG. 2. As described above, turning off those switch transistors in the main circuit 110 may introduce a surge voltage to the power line 115. For example, the power line 115 is configured to provide a normal level of voltage V1, and in situations where those switch transistors are turned off, a surge voltage V2 that is greater than the voltage V1 and greater than the breakdown voltage BV1 may be created. That is, the supply voltage Vpp provided by the power line 115 may be equal to the normal level of voltage V1 or the surge voltage V2. If the surge voltage V2 is fully applied to the second node 110b of the main circuit 110, since the surge voltage V2 is greater than the breakdown voltage BV1, those switch transistors in the main circuit 110 may be damaged. To prevent the main circuit 110 from being damaged by the surge voltage V2, an auxiliary circuit 130 is electrically coupled to main circuit 110 to provide a surge protection.

The auxiliary circuit 130 includes a capacitor 140. One terminal 140a of the capacitor 140 is electrically coupled to the second node 110b of the main circuit 110. In an embodiment, a capacitance of the capacitor 140 may be between about 1 pF and about 100 nF. The auxiliary circuit 130 also includes a resistor 150 electrically coupled to the other terminal 140b of the capacitor 140a. In the present embodiments, the other terminal of the resistor 150 is configured to receive a reference voltage (e.g., ground voltage GND). In an embodiment, a resistance of the resistor 150 may be between about 1 KΩ and about 100 KΩ.

The auxiliary circuit 130 also includes a transistor 160. The transistor 160 has a first terminal 160a (e.g., gate terminal) electrically coupled to the terminal 140b of the capacitor 140, a second terminal 160b electrically coupled to the second node 110b of the main circuit 110, and a third terminal 160c configured to receive a reference voltage (e.g., ground voltage GND). In an embodiment, the transistor 160 includes a GaN-based HEMT and has a breakdown voltage BV2 that is higher than the breakdown voltage BV1 of the switching transistors in the main circuit 110. It is understood that transistor 160 is not limited to a GaN-based HEMT. In an embodiment, an operation voltage of the transistor 160 is higher than an operation voltage of each of the switch transistors in the main circuit 110. When the switching transistors in the main circuit 110 are turned off and a surge voltage V2 is generated, or there is a spike voltage V2 from system, a surge current will flow through the capacitor 140 and build up a voltage by the resistor 150. This built-up voltage may then turn on the transistor 160. Thus, the surge voltage/spike voltage V2 may be discharged by the transistor 160. An exemplary cross-sectional view of a structure of the transistor 160 will be described in detail with reference to FIG. 4. In some embodiments, by providing different transistors 160 (having different breakdown voltages) for the auxiliary circuit 130, the switching circuit 100 may be configured to sustain different surge voltages, and thus the switching circuit 100 may be implemented in different applications.

Figure 2:
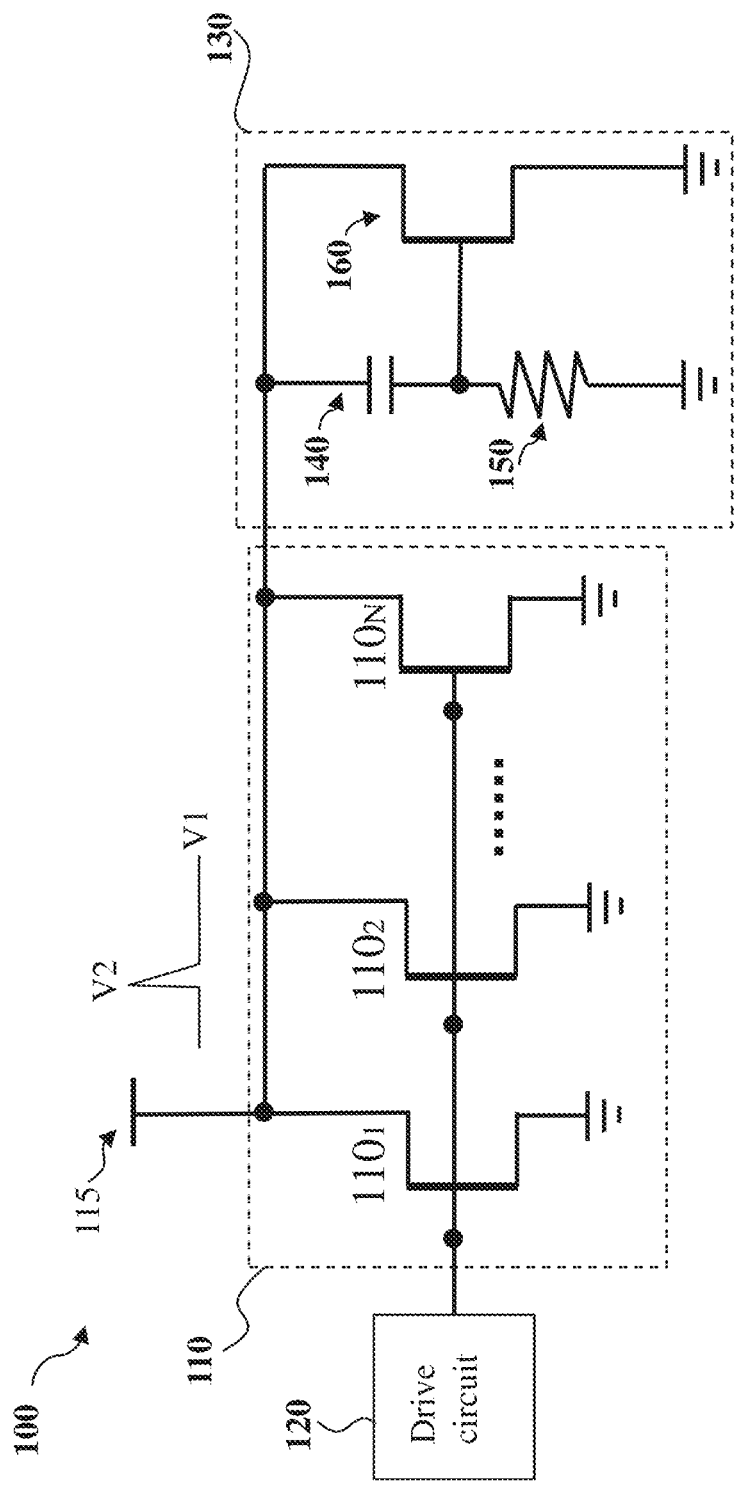
FIG. 2 illustrates a schematic of an exemplary simplified main circuit of the switching circuit shown in FIG. 1, according to various aspects of the present disclosure.

FIG. 2 illustrates a schematic of an exemplary simplified main circuit 110 of the switching circuit 100 shown in FIG. 1, according to various aspects of the present disclosure. In embodiments represented in FIG. 2, the main circuit 110 includes a number of switch transistors $110_1$, $110_2$, ... $110_N$ in parallel connection. N is an integer and may be greater than 1000. The switch transistors $110_1$, $110_2$, ... $110_N$ are connected in parallel. More specifically, each of the switch transistors $110_1$, $110_2$, ... $110_N$ includes a gate terminal, a drain terminal, and a source terminal. The gate terminals of those switch transistors $110_1$, $110_2$, ... $110_N$ are electrically coupled to an output of the drive circuit 120 and are configured to receive the control signal from the drive circuit 120, the drain terminals of those switch transistors $110_1$, $110_2$, ... $110_N$ are electrically coupled to the power line 115, and the source terminals of those switch transistors $110_1$, $110_2$, ... $110_N$ are configured to receive, for example, a ground voltage. In an embodiment, each of the switch transistors $110_1$, $110_2$, ... $110_N$ includes a GaN-based HEMT, and each HEMT has the same structure and configuration, and thus has the same breakdown voltage BV1. For example, those HEMTs in the main circuit 110 have the same gate width Wg1 (shown in FIG. 5) and same distance between the gate structure and its respective drain feature (i.e., Lgd1 shown in FIG. 3 and FIG. 5). The distance between the gate structure and its respective drain feature of the HEMT based transistor 160 in the auxiliary circuit 130 may be referred to as Lgd2 (shown in FIG. 4 and FIG. 6) and is greater than the distance Lgd1. A fragmentary cross-sectional view of an exemplary structure of the switch transistors $110_1$, $110_2$, ... $110_N$ will be described in further detail with reference to FIG. 3. It is understood that each of the switch transistors $110_1$, $110_2$, ... $110_N$ is not limited to a GaN-based HEMT.

In an embodiment, the first breakdown voltage BV1 may be about 500V, and the second breakdown voltage BV2 may be about 800V, and the main circuit 110 may include 3000 switch transistors, a total gate width of the 3000 switch transistors may be about 300 mm. To prevent the main circuit 110 from being damaged due to surge voltage, instead of providing the auxiliary circuit 130, another possible method may include increasing the length of the drain drift region (i.e., the region between gate structure and its respective drain feature) of each switch transistor of those 3000 switch transistors in the main circuit 110 from Lgd1 to Lgd2. However, increasing the length of the drain drift region of each switch transistor from Lgd1 to Lgd2 may significantly and disadvantageously increase a total footprint of the main circuit 110. For example, a total chip area of a main circuit that includes switch transistors each having the second breakdown voltage BV2 may be about 7 mm²; however, a total chip area of a main circuit that includes switch transistors each having the first breakdown voltage BV1 may be about 4.2 mm² and a total chip area of the auxiliary circuit may be about 0.02 mm². Therefore, compared with embodiments where the length of the drain drift region of each switch transistor is increased from Lgd1 to Lgd2 to increase the breakdown voltage from BV1 to BV2, the switching circuit 100 that implements the auxiliary circuit 130 may have a smaller footprint (reduced by 40%) and takes less amount of real estate of an IC chip.

FIG. 3 illustrates an exemplary cross-sectional view of the switch transistor $110_1$ implemented in the main circuit 110 shown in FIG. 2, according to various aspects of the present disclosure. Since the switch transistor $110_1$ includes a HEMT, the switch transistor $110_1$ may be referred to as a semiconductor device $110_1$ or a HEMT $110_1$. The semiconductor device $110_1$ includes a substrate 310. The substrate 310 may include silicon carbide (SiC), sapphire, or silicon (Si). In the present embodiment, the substrate 310 is a silicon substrate.

The semiconductor device $110_1$ also includes a nucleation layer 320 formed over the substrate 310. The nucleation layer 320 has a lattice structure and/or a thermal expansion coefficient (TEC) suitable for, example, bridging the lattice mismatch and/or the TEC mismatch between the substrate 310 and a layer thereover. In some embodiments, the nucleation layer 320 includes aluminum nitride (AlN).

The semiconductor device $110_1$ also includes a buffer layer 330 formed over the nucleation layer 320. In some embodiments, the buffer layer 330 includes a graded aluminum-gallium nitride ($Al_xGa_{1-x}N$, x is the aluminum content ratio in the aluminum-gallium constituent, 0<x<1) layer. In some embodiments, the buffer layer 330 may include multiple aluminum gallium nitride layers with different x ratios. In some other embodiments, instead of having multiple layers with different x ratios, the buffer layer 330 may have a continuous gradient of the ratio x.

The semiconductor device $110_1$ also includes a super lattice structure 340 formed over the buffer layer 330. The super lattice structure 340 may include a number of first group III-V layers and a number of second group III-V layers (not separately labeled) vertically and alternatingly stacked, and the first group III-V layers have a lattice constant different than the second group III-V layers. For example, the first group III-V layers may include AlN, and the second group III-V layers may include GaN.

The semiconductor device $110_1$ also includes a channel layer 350 formed over the super lattice structure 340. In some embodiments, the channel layer 350 may include one or more Group III-V compound layers such as GaN, AlGaN, InGaN and InAlGaN. In one embodiment, the channel layer 350 includes a GaN layer.

The semiconductor device $110_1$ also includes an active layer 360 formed over the channel layer 350. The active layer 360 includes one or more Group III-V compound layers which are different from the Group III-V compound layers of the channel layer 350 in composition. In an embodiment, the active layer 360 may include AlGaN. The active layer 360 is configured to cause a 2-dimensional electron gas (2DEG) to be formed in the channel layer 350 along an interface between the channel layer 350 and the active layer 360. A heterojunction is formed between the active layer 360 and the channel layer 350 having two different semiconductor materials.

The semiconductor device $110_1$ also includes a source feature 365 and a drain feature 370 disposed over the active layer 360. In the present embodiments, the source feature 365 and drain feature 370 are formed to be in ohmic contact with an upper surface of the active layer 360. In some situations, the source feature 365 may be referred to as a source contact 365, and the drain feature 370 may be referred to as a drain contact 370. In some embodiments, the source contact 365 and the drain contact 370 may have the same composition and may include a metal layer that include titanium (Ti), titanium nitride (TiN), aluminum copper (AlCu) alloy, combinations thereof, or other suitable materials.

The semiconductor device $110_1$ also includes a gate structure 375 disposed over the active layer 360 and between the source feature 365 and the drain feature 370. The gate structure 375 includes a gate dielectric layer and a gate electrode layer disposed over the gate dielectric layer. The gate electrode includes a conductive material layer. In various examples, the conductive material layer may include nickel (Ni), gold (Au) copper (Cu), titanium (Ti), titanium nitride (TiN), titanium tungsten (TiW), titanium tungsten nitride (TiWN), tungsten (W) or tungsten nitride (WN), combinations thereof, or other suitable materials. In the present embodiments, along the X direction, a distance Lgd1 between the gate structure 375 and the drain contact 370 is greater than a distance between the gate structure and the source contact 365. A dielectric layer 380 is formed over the source feature 365, the drain feature 370, and the gate structure 375. The dielectric layer 380 may include multiple layers and each layer may include silicon oxide ($SiO_2$), silicon nitride (SiN), combinations thereof, or other suitable materials. The semiconductor device $110_1$ also includes contact vias penetrating through the dielectric layer 380 and in direct contact with the source feature 365, the drain feature 370, or the gate structure 375. For example, the semiconductor device $110_1$ includes a contact via 385 extending through the dielectric layer 380 and in direct contact with the source feature 365. In some embodiments, the semiconductor device $110_1$ may also include one or more field plates (e.g., field plate 390) disposed over the dielectric layer 380. In the present embodiments, the semiconductor device $110_1$ includes a field plate 390 disposed over the dielectric layer 380 and electrically coupled to the source feature 365 via the contact via 385.

FIG. 4 illustrates an exemplary cross-sectional view of the transistor 160 implemented in the auxiliary circuit 1630 shown in FIG. 1, according to various aspects of the present disclosure. In the present embodiments, a structure of the transistor 160 is in a way similar to that of the switch transistor $110_1$. For example, the transistor 160 also includes the substrate 310, the nucleation layer 320 formed over the substrate 310, the buffer layer 330 formed over the nucleation layer 320, the super lattice structure 340 formed over the buffer layer 330, the channel layer 350 formed over the super lattice structure 340, and the active layer 360 formed over the channel layer. The transistor 160 also includes a source feature 465 and a drain feature 470 disposed over the active layer 360, and a gate structure 475 disposed between the source feature 465 and the drain feature 470. A distance Lgd2 between the gate structure 475 and the drain feature 470 is greater than a distance between the gate structure 475 and the source feature 465. Since the auxiliary circuit 130 is configured to provide surge protection for the transistors $110_1$, $110_2$, ..., $110_N$ in the main circuit 110, a breakdown voltage BV2 of the transistor 160 is higher than a breakdown voltage BV1 of the switch transistor $110_1$. In the present embodiments, the distance Lgd2 between the gate structure 475 and the drain feature 470 is greater than the distance Lgd1 between the gate structure 375 and the drain feature 370 such that the transistor 160 has a higher breakdown voltage than the switch transistor $110_1$.

FIG. 5 illustrates a fragmentary top view of the switch transistor $110_1$, according to various aspects of the present disclosure. In the present embodiments, the gate structure 375 extends along the Y direction and has a gate width Wg1 along the Y direction. In an embodiment, the gate width Wg1 is between about 50 um and about 150 um. The distance Lgd1 may be configured accordingly with respect to a satisfactory breakdown voltage BV1 of the switch transistor $110_1$. In an embodiment, the breakdown voltage BV1 of the switch transistor $110_1$ may be about 500V, and the distance Lgd1 may be between about 6 um and about 18 um. The gate width Wg1 and the distance Lgd1 may affect a footprint of the transistor $110_1$.

FIG. 6 illustrates a fragmentary top view of the transistor 160, according to various aspects of the present disclosure. In the present embodiments, the gate structure 475 extends along the Y direction and has a gate width Wg2 along the Y direction. In an embodiment, Wg2 is between about 50 um and about 150 um. The distance Lgd2 is greater than the distance Lgd1. The distance Lgd2 may be configured with respect to a satisfactory breakdown voltage BV2 of the transistor 160 and is no more than 1000 um. If the distance Lgd2 is greater than 1000 um, a larger current is needed to turn on the transistor 160, more time may be needed to charge the capacitor to generate this larger current, and the transistor 160 may thus not be able to discharge the surge voltage in time.

In an embodiment, the breakdown voltage BV2 of the transistor 160 may be about 800V, and the distance Lgd2 is greater than the distance Lgd1 and may be between about 9 um and about 27 um. In an embodiment, to provide the transistor 160 a higher breakdown voltage (e.g., 1000V), the distance Lgd2 may be increased and between about 12 um and about 35 um. In an embodiment, the distance Lgd2 may be greater than 23 um. The gate width Wg2 and the distance Lgd2 may affect a footprint of the transistor 160. In some embodiments, the gate width Wg2 may be equal to the gate width Wg1. In an embodiment, a footprint of the transistor 160 is greater than a footprint of each switch transistor of the switch transistors $110_1$, $110_2$, ..., $110_N$ in the main circuit 110, and the footprint of the transistor 160 is less than a total footprint of the switch transistors $110_1$, $110_2$, ..., $110_N$ in the main circuit 110.

Figure 7:
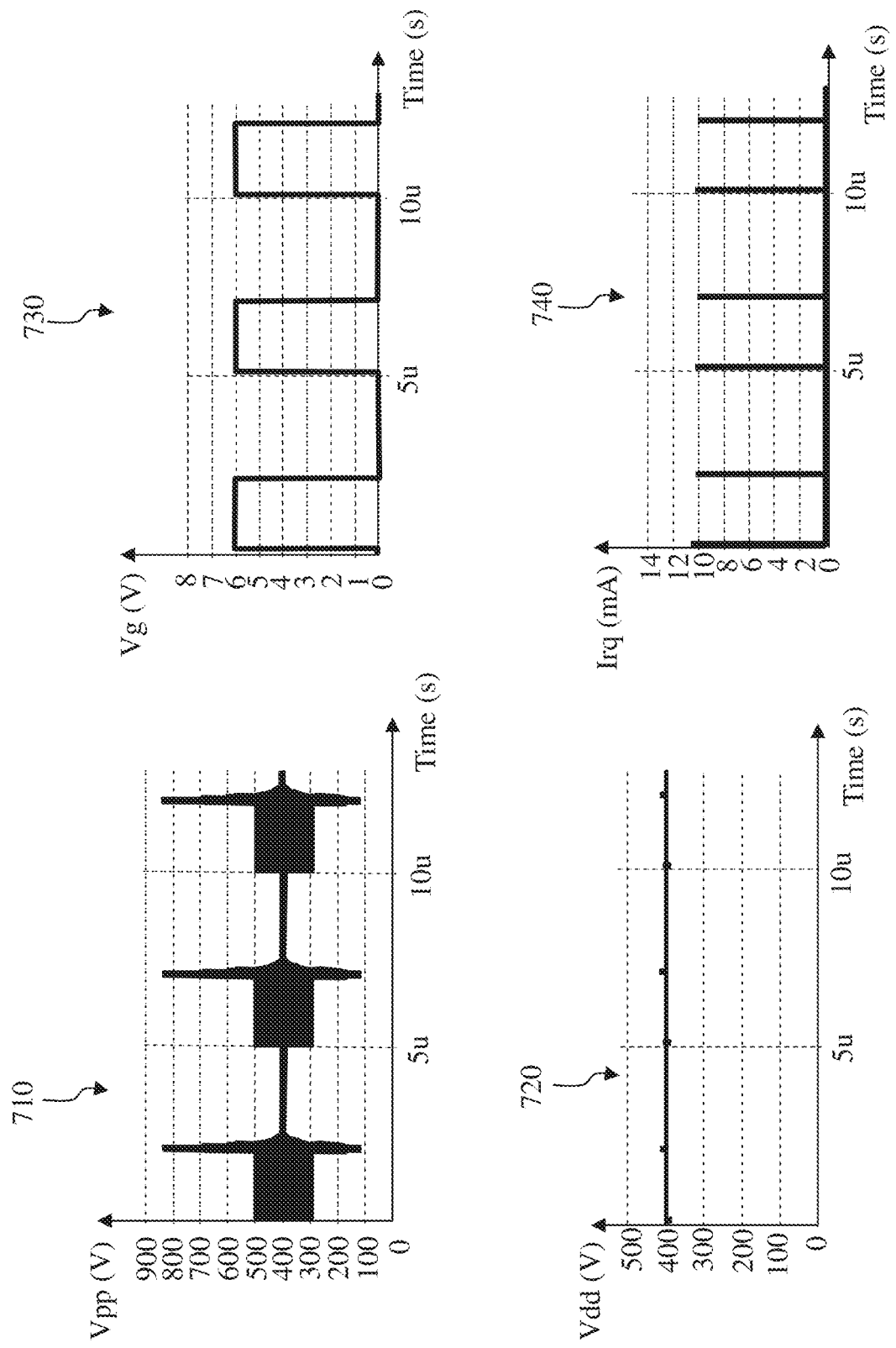
FIG. 7 illustrates simulated timing diagrams showing voltages over time or current over time at different nodes of the switching circuit shown in FIG. 1.

FIG. 7 illustrates simulated timing diagrams 710, 720, 730, and 740 showing voltages over time or current over time at different nodes of the switching circuit 100 shown in FIG. 1. More specifically, timing diagram 710 represents a voltage signal Vpp provided by the power line 115, timing diagram 720 represents a voltage signal Vdd measured at the second node 110b of the main circuit 110, timing diagram 730 represents a voltage signal Vg measured at the first node 110a of the main circuit 110, and timing diagram 740 represents a current Irq that flows through the transistor 160.

In this present simulation, the power line 115 is configured to provide a voltage Vpp. A normal level V1 of the voltage Vpp is ranged between about 300V and about 500V, the switch transistors $110_1$, $110_2$, ..., $110_N$ in the main circuit 110 each has the distance Lgd1 (shown in FIG. 3 and FIG. 5), each transistor in the main circuit 110 has an operation voltage that is about 400V and a breakdown voltage that is about 500V, and the transistor 160 in the auxiliary circuit 130 has a distance Lgd2 (shown in FIG. 4 and FIG. 6), operation voltage that is about 650V, and a breakdown voltage that is about 800V. When the switch transistors $110_1$, $110_2$, ..., $110_N$ in the main circuit 110 are turned off, as represented by the timing diagram 730, the power line 115 provides surge voltages V2. The surge voltages may be greater than 800V. By providing the auxiliary circuit 130, as represented by the timing diagram 720, the voltage Vdd that is supplied to the main circuit 110 may be between about 395V and about 405V, which is less than the breakdown voltage of the transistors $110_1$, $110_2$, ..., $110_N$ in the main circuit 110, and the surge voltage is discharged by the transistor 160, as presented by the timing diagram 740. Therefore, providing the auxiliary circuit 130 to increase the breakdown voltage of the switching circuit 100 may advantageously prevent the switch transistors $110_1$, $110_2$, ..., $110_N$ in the main circuit 110 from being damaged by the surge voltage V2. Besides providing surge protection, compared with embodiments where the breakdown voltage of the transistors $110_1$, $110_2$, ..., $110_N$ in the main circuit 110 are increased to prevent damages due to surge voltage, the implementation of the auxiliary circuit 130 also advantageously reduces a total footprint of the switching circuit 100.

Figure 8:
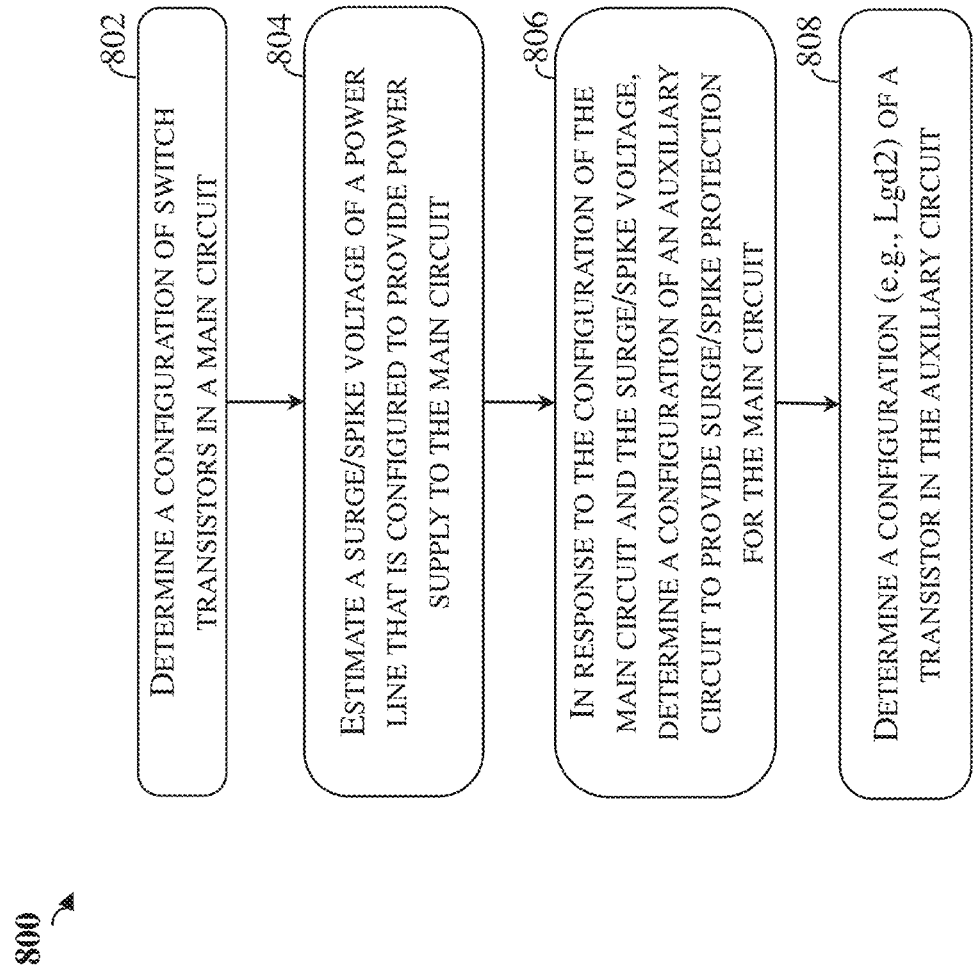
FIG. 8 illustrates a flow chart of a method for configuring a switch circuit to have an increased breakdown voltage.

FIG. 8 illustrates a flow chart of a method 800 for configuring a switch circuit to have an increased breakdown voltage. In an embodiment, the method 800 includes, at 802, determining a configuration of switch transistors in a main circuit. For example, a breakdown voltage BV1 and the length Lgd1 of each switch transistor of the transistors $110_1$, $110_2$, ..., $110_N$ in the main circuit 110 may be determined. The method 800 also includes, at 804, estimating a surge voltage/spike voltage (e.g., V2) of a power line (e.g., power line 115) that is configured to provide power supply to the main circuit 110. The method 800 also includes, at 806, in response to the configuration of the main circuit and the surge/spike voltage, determining a configuration of an auxiliary circuit to provide a surge/spike protection for the main circuit 110. For example, based on the surge voltage V2 and the breakdown voltage BV1 of the switch transistors $110_1$, $110_2$, ..., $110_N$ in the main circuit 110, a breakdown voltage BV2 of the transistor 160 in the auxiliary circuit 130 may be determined. The method 800 also includes, at 808, in response to the determined breakdown voltage BV2 of the transistor 160, determining a configuration of the transistor 160. For example, a distance Lgd2 between a gate structure and a drain feature of the transistor 160 may be determined such that the transistor 160 has the breakdown voltage BV2. As such, the auxiliary circuit 130 may be configured to provide surge/spike protection for the main circuit 110. In other words, the breakdown voltage of the switching circuit 100 is increased by the auxiliary circuit 130.

Figure 9:
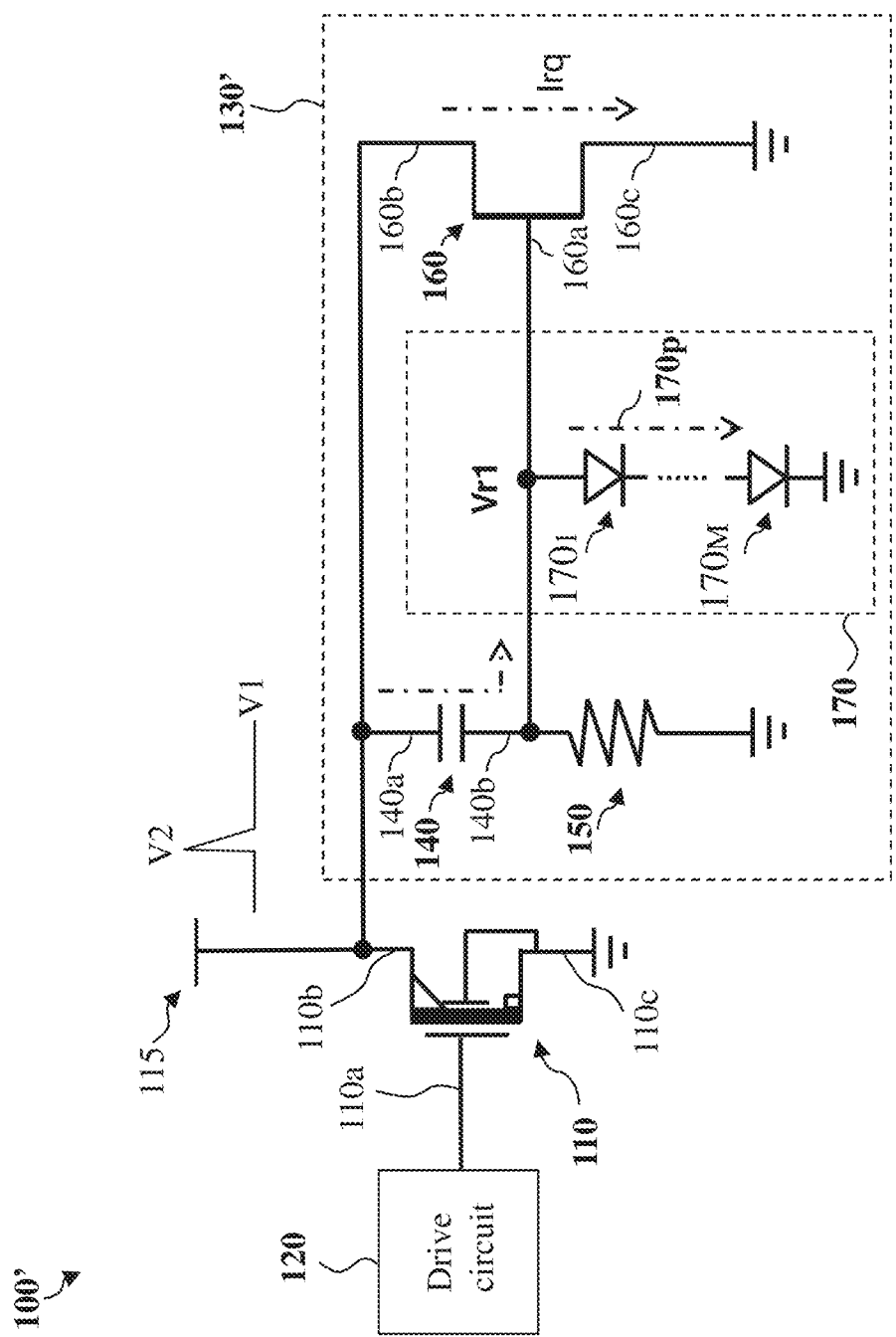
FIG. 9 illustrates a schematic of another exemplary simplified switching circuit having the main circuit and a different auxiliary circuit, according to various aspects of the present disclosure.

FIG. 9 illustrates a schematic of another exemplary simplified switching circuit 100' having an auxiliary circuit 130', according to various aspects of the present disclosure. In the present embodiments, the switching circuit 100' includes the main circuit 110 having the first node 110a electrically coupled to the drive circuit 120, the second node 110b electrically coupled to the power line 115, and the third node 110c electrically coupled to a reference voltage such as a ground voltage. As described above with reference to FIGS. 1 and 2, the main circuit 110 includes a number of switch transistors $110_1$, $110_2$, ..., $110_N$ connected in parallel.

The switching circuit 100' also includes an auxiliary circuit 130' electrically coupled to the second node 110b of the main circuit 110. The auxiliary circuit 130' includes the capacitor 140. One terminal 140a of the capacitor 140 is electrically coupled to the second node 110b of the main circuit 110. The auxiliary circuit 130' also includes the resistor 150 electrically coupled to the other terminal 140b of the capacitor 140a. The auxiliary circuit 130' also includes the transistor 160. The first terminal 160a (e.g., gate terminal) of the transistor 160 is electrically coupled to the terminal 140b of the capacitor 140, the second terminal 160b (e.g., drain terminal) of the transistor 160 is electrically coupled to the second node 110b of the main circuit 110, and the third terminal 160c is configured to receive a reference voltage (e.g., ground voltage GND). In an embodiment, the transistor 160 includes a GaN-based HEMT and has a breakdown voltage BV2 that is higher than the breakdown voltage BV1 of the switching transistors in the main circuit 110. Thus, when the switching transistors in the main circuit 110 are turned off and when a surge voltage V2 is generated, the capacitor 140 may turn on the transistor 160 and thus the surge voltage V2 may be discharged by the transistor 160.

As described above, when switch transistors $110_1$, $110_2$, ..., $110_N$ in the main circuit 110 are turned off, a surge voltage V2 that is greater than the voltage V1 and greater than the breakdown voltage BV1 may be created. The gate terminal (i.e., the first terminal 160a) of the transistor 160 is susceptible to damage due to voltage overshoot spikes that exceed its gate breakdown voltage. The auxiliary circuit 130' includes a gate protection circuit 170 electrically coupled to the terminal 140b of the capacitor 140 and the first terminal 160a of the transistor 160. More specifically, the gate protection circuit 170 includes one terminal connected to the terminal 140b of the capacitor 140, and the other terminal configured to receive a reference voltage (e.g., a ground voltage). In the present embodiments, the gate protection circuit 170 includes a number of diodes $170_1$, ..., $170_M$, connected in serial. M is an integer and is greater than 1. In some embodiments, M may be between 2 and 10, depending on the threshold voltage of each of the diodes $170_1$, ..., $170_M$ and the gate breakdown voltage of the transistor 160. Current that is generated due to the surge event may partially flow through the path 170p. By implementing the gate protection circuit 170, a gate input voltage of the transistor 160 may be clamped during a surge event, protecting the gate terminal of the transistor 160 from being damaged. In some embodiments, the gate protection circuit 170 may consume portions of the surge voltage not consumed by the resistor 150 or the transistor 160.

Figure 10:
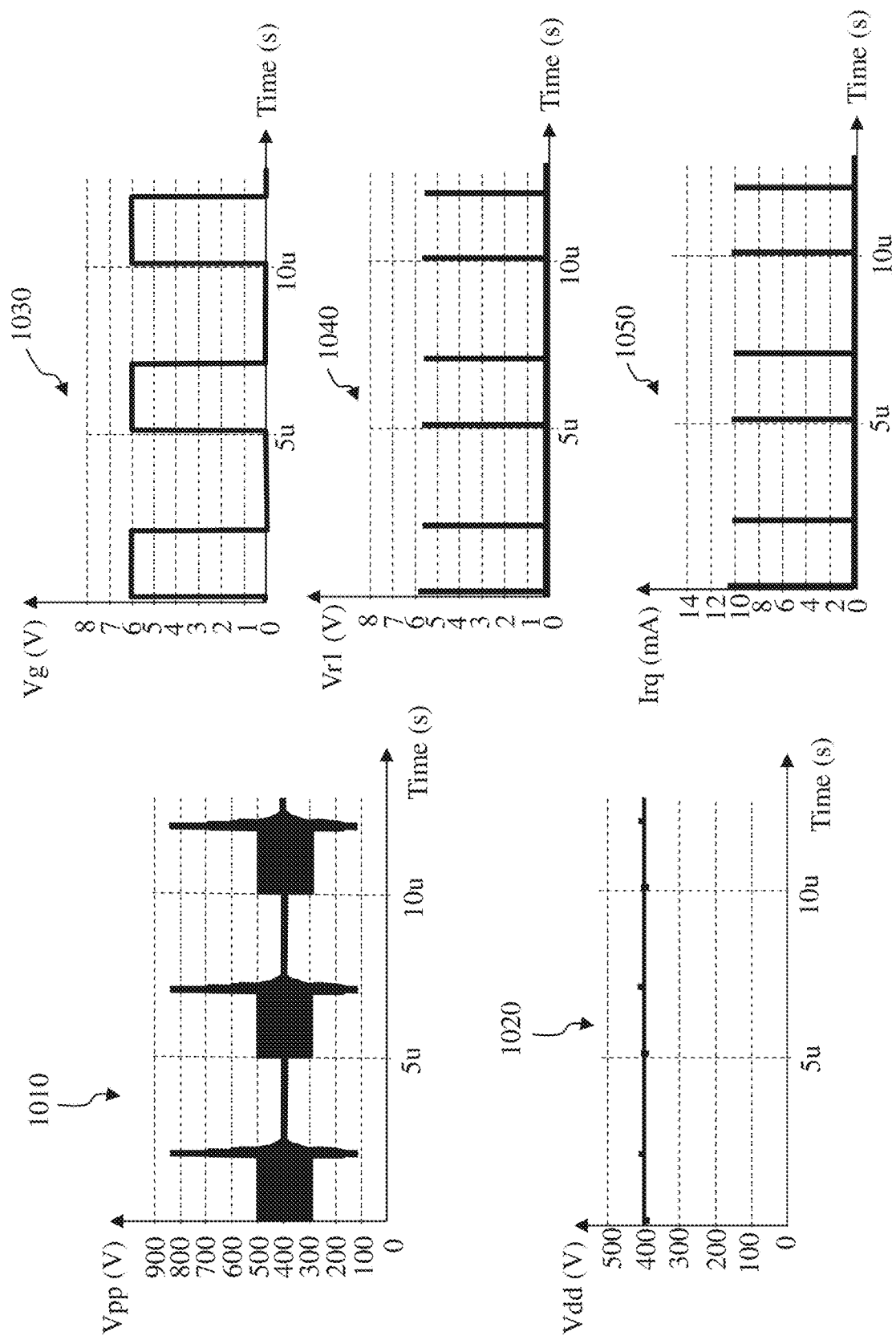
FIG. 10 illustrates simulated timing diagrams showing the voltages over time or current over time at different nodes of the switching circuit shown in FIG. 9.

FIG. 10 illustrates simulated timing diagrams 1010, 1020, 1030, 1040, and 1050 showing the voltage or current over time at different nodes of the switching circuit shown in FIG. 9. More specifically, timing diagram 1010 represents a voltage signal Vpp provided by the power line 115, timing diagram 1020 represents a voltage signal Vdd measured at the second node 110b of the main circuit 110, timing diagram 930 represents a voltage signal Vg measured at the first node 110a of the main circuit 110, timing diagram 1040 represents a voltage signal Vr1 measured at the terminal 140b of the capacitor 140, and timing diagram 1050 represents a current Irq that flows through the transistor 160. The timing diagrams 1010, 1020, 1030, and 1050 are in a way similar to the timing diagrams 710, 720, 730, and 740 described with reference to FIG. 7 and repeated description is omitted for reason of simplicity. When the transistors $110_1$, $110_2$, ..., $110_N$ in the main circuit 110 are turned on or off, as represented by the timing diagram 1040, current that is generated due to the surge event may flow through the path 170p, protecting the gate terminal of the transistor 160 from being damaged.

Although not intended to be limiting, one or more embodiments of the present disclosure provide many benefits to a switching circuit. In an embodiment, a switching circuit includes a main circuit and an auxiliary circuit electrically coupled to the main circuit. The auxiliary circuit includes a power device (e.g., GaN-based HEMT) and is configured to provide surge protection for the main circuit. The main circuit may include a number of transistors that have a breakdown voltage less than a breakdown voltage of the power device. Therefore, without significantly consuming an amount of real estate of an IC chip, the main circuit may be protected from damage due to voltage overshoot spikes. In some embodiments, the breakdown voltage of the power device may be adjusted by changing a distance between a gate structure and a drain feature of the power device. As such, by providing the power device different breakdown voltages, without changing the configuration of the main circuit, the switching circuit may be designed to be implemented for various applications having different surge voltages. In some embodiments, a gate protection circuit is electrically coupled to the power device to protect the gate terminal of the power device. In some embodiments, the auxiliary circuit may be implemented to provide surge protection for other circuits that can adjust the distance between the gate structure and the drain feature to design breakdown voltages. The auxiliary circuit may be readily integrated into existing HEMTs and circuits.

The present disclosure provides for many different embodiments. Semiconductor structures and methods of fabrication thereof are disclosed herein. In one exemplary aspect, the present disclosure is directed to a switching circuit. The switching circuit includes a main circuit including a plurality of first transistors and having a first node, a second node, and a third node, where the main circuit is operative in response to a control signal received by the first node, and the second node is configured to receive a supply voltage. The switching circuit also includes an auxiliary circuit electrically coupled to the second node of the main circuit and configured to provide surge protection for the main circuit, where the auxiliary circuit comprises a second transistor. A breakdown voltage of the second transistor is different than a breakdown voltage of each first transistor of the plurality of first transistors.

In some embodiments, the breakdown voltage of the second transistor may be greater than the breakdown voltage of each first transistor of the plurality of first transistors. In an embodiment, each first transistor of the plurality of first transistors may include a gate terminal electrically coupled to the first node, a drain terminal electrically coupled to the second node, and a source terminal electrically coupled to the third node. In an embodiment, the auxiliary circuit may also include a capacitive element comprising a first terminal and a second terminal, where the first terminal of the capacitive element may be electrically coupled to the second node. The auxiliary circuit may also include a resistive element comprising a third terminal and a fourth terminal, the third terminal being electrically coupled to the second terminal, and the fourth terminal being electrically coupled to a ground voltage. In an embodiment, a gate terminal of the second transistor may be electrically coupled to the second terminal of the capacitive element, a drain terminal of the second transistor may be electrically coupled to the second node, and a source terminal of the second transistor may be electrically coupled to a ground voltage. In an embodiment, the switching circuit may also include a gate protection circuit electrically coupled to the second terminal of the capacitive element, where the gate protection circuit may include a plurality of diodes connected in serial. In an embodiment, the first transistor may be a first III-V based high-electron-mobility transistor (HEMT) and the second transistor may be a second III-V based HEMT. In an embodiment, a substrate of the first III-V based HEMT and a substrate of the second III-V based HEMT may include silicon. In an embodiment, the first III-V based HEMT may be a first gate structure and a first drain feature, and the first gate structure may be spaced apart from the first drain feature by a first distance along a first direction, and the second III-V based HEMT may be a second gate structure and a second drain feature, and the second gate structure may be spaced apart from the second drain feature by a second distance along the first direction, where the second distance may be greater than the first distance. In an embodiment, a width of the first gate structure along a second direction may be equal to a width of the second gate structure along the second direction, the second direction being substantially perpendicular to the first direction.

In another exemplary aspect, the present disclosure is directed to a circuit. The circuit includes a drain voltage input terminal configured to receive a first voltage, a source voltage input terminal configured to receive a second voltage, a main circuit connected between the drain voltage input terminal and the source voltage input terminal and comprising a plurality of first transistors in parallel connection, a second transistor comprising a drain terminal electrically coupled to the drain voltage input terminal, a source terminal electrically coupled to the source voltage input terminal, and a gate terminal, a capacitive element comprising a first terminal and a second terminal, the first terminal of the capacitive element being electrically coupled to the drain voltage input terminal, and a resistive element comprising a third terminal and a fourth terminal, the third terminal being electrically coupled to the second terminal, and the fourth terminal being electrically coupled to the source voltage input terminal, where the gate terminal of the second transistor is electrically coupled to the second terminal of the capacitive element.

In some embodiments, a breakdown voltage of the second transistor may be greater than a breakdown voltage of each first transistor of the plurality of first transistors. In some embodiments, a sum of the breakdown voltage of the second transistor and the breakdown voltage of each first transistor of the plurality of first transistors may be greater than a surge voltage associated with the first voltage. In some embodiments, an operation voltage of the second transistor may be greater than an operation voltage of each first transistor of the plurality of first transistors. In some embodiments, a footprint of the second transistor may be greater than a footprint of each first transistor of the plurality of first transistors and may be smaller than a total footprint of the plurality of first transistors. In some embodiments, the circuit may also include a plurality of diodes connected in serial and connected between the second terminal of the capacitive element and the source voltage input terminal.

In yet another exemplary aspect, the present disclosure is directed to a circuit. The circuit includes a first circuit configured to receive a power supply voltage from a power line and comprising a plurality of first power devices connected in parallel, wherein each first power device of the plurality of first power devices comprises a first breakdown voltage, a second circuit configured to provide surge protection to the first circuit and comprising a second power device having a second breakdown voltage, where the first breakdown voltage is less than the second breakdown voltage.

In some embodiments, the second circuit may also include a capacitive element comprising a first terminal and a second terminal, the first terminal of the capacitive element being electrically coupled to the power line, and a resistive element comprising a third terminal and a fourth terminal, the third terminal being electrically coupled to the second terminal, and the fourth terminal being electrically coupled to a ground voltage, where a gate terminal of the second power device may be electrically coupled to the second terminal of the capacitive element, a drain terminal of the second power device may be electrically coupled to the power line, and a source terminal of the second power device may be electrically coupled to the ground voltage. In some embodiments, the circuit may also include a gate protection circuit electrically connected between the second terminal of the capacitive element and the ground voltage, where the gate protection circuit may include a plurality of diodes connected in serial. In some embodiments, each of the plurality of first power devices may include a gate structure spaced from a drain feature by a first distance, the second power device may include a gate structure spaced from a drain feature by a second distance, where the second distance may include greater than the first distance.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A switching circuit comprising:
   a main circuit comprising a plurality of first transistors and comprising a first node, a second node, and a third node, wherein the main circuit is operative in response to a control signal received by the first node, and the second node is configured to receive a supply voltage;
   an auxiliary circuit electrically coupled to the second node of the main circuit and configured to provide surge protection for the main circuit, wherein the auxiliary circuit comprises:
   a second transistor, wherein a breakdown voltage of the second transistor is different than a breakdown voltage of each transistor of the plurality of first transistors,
   a plurality of diodes connected in serial, wherein an anode of one of the plurality of diodes is electrically coupled to a gate terminal of the second transistor, and
   a resistive element connected in parallel with the plurality of diodes.

2. The switching circuit of claim 1, wherein the breakdown voltage of the second transistor is greater than the breakdown voltage of each transistor of the plurality of first transistors.

3. The switching circuit of claim 1, wherein each transistor of the plurality of first transistors comprises a gate terminal electrically coupled to the first node, a drain terminal electrically coupled to the second node, and a source terminal electrically coupled to the third node.

4. The switching circuit of claim 1, wherein the auxiliary circuit further comprises:
   a capacitive element comprising a first terminal and a second terminal, wherein the first terminal of the capacitive element is electrically coupled to the second node, and the second terminal of the capacitive element is electrically coupled to the resistive element and the anode.

5. The switching circuit of claim 4, wherein the gate terminal of the second transistor is electrically coupled to the second terminal of the capacitive element, a drain terminal of the second transistor is electrically coupled to the second node, and a source terminal of the second transistor is electrically coupled to a ground voltage.

6. The switching circuit of claim 4, wherein a cathode of another one of the plurality of diodes is electrically coupled to a ground voltage.

7. The switching circuit of claim 1, wherein each transistor of the plurality of first transistors comprises a first high-electron-mobility transistor (HEMT) and the second transistor comprises a second HEMT.

8. The switching circuit of claim 7, wherein a substrate of the first HEMT and a substrate of the second HEMT comprise silicon.

9. The switching circuit of claim 7,
   wherein the first HEMT comprises a first gate structure and a first drain feature, and the first gate structure is spaced apart from the first drain feature by a first distance along a first direction, and the second HEMT comprises a second gate structure and a second drain feature, and the second gate structure is spaced apart from the second drain feature by a second distance along the first direction,
   wherein the second distance is greater than the first distance.

10. The switching circuit of claim 9,
    wherein a width of the first gate structure along a second direction is equal to a width of the second gate structure along the second direction, the second direction being substantially perpendicular to the first direction.

11. A circuit comprising:
    a main circuit comprising a plurality of first transistors in parallel connection and a first terminal coupled to a power line;
    a second transistor comprising a drain terminal electrically coupled to the first terminal of the main circuit and having a breakdown voltage higher than a breakdown voltage of the main circuit, wherein a footprint of the second transistor is greater than a footprint of each transistor of the plurality of first transistors and is smaller than a total footprint of the plurality of first transistors; and
    a capacitor comprising a first terminal electrically coupled to the first terminal of the main circuit and a second terminal electrically coupled to a gate terminal of the second transistor.

12. The circuit of claim 11, wherein the breakdown voltage of the second transistor is greater than a breakdown voltage of each transistor of the plurality of first transistors.

13. The circuit of claim 12, wherein a sum of the breakdown voltage of the second transistor and the breakdown voltage of each transistor of the plurality of first transistors is greater than a surge voltage associated with the power line.

14. The circuit of claim 11, wherein an operation voltage of the second transistor is greater than an operation voltage of each transistor of the plurality of first transistors.

15. The circuit of claim 11, further comprising:
    a resistor comprising a third terminal electrically coupled to the second terminal and a fourth terminal electrically coupled to a ground voltage.

16. A circuit, comprising:
    a plurality of first transistors connected in parallel, wherein each transistor of the plurality of first transistors has a first gate structure and a first drain feature spaced from the first gate structure by a first distance; and
    a second transistor having a second gate structure and a second drain feature spaced from the second gate structure by a second distance the second distance is greater than the first distance,
    wherein the second drain feature is electrically coupled to the first drain features.

17. The circuit of claim 16, further comprising:
    a capacitive element comprising a first terminal and a second terminal, the first terminal of the capacitive element being electrically coupled to the first drain feature; and
    a resistive element comprising a third terminal and a fourth terminal, the third terminal being electrically coupled to the second terminal, and the fourth terminal being electrically coupled to a ground voltage, wherein the second gate structure is electrically coupled to the second terminal of the capacitive element, and a source feature of the second transistor is electrically coupled to the ground voltage.

18. The circuit of claim 17, further comprising:
a plurality of diodes connected in serial and electrically connected between the second terminal of the capacitive element and the ground voltage.

19. The circuit of claim 16, wherein a gate width of each transistor of the plurality of first transistors is equal to a gate width of the second transistor.

20. The circuit of claim 11, wherein the second transistor comprises a III-V based high-electron-mobility transistor (HEMT).

* * * * *